United States Patent
Macri et al.

(10) Patent No.: US 7,752,476 B2
(45) Date of Patent: Jul. 6, 2010

(54) FAST TRANSITION FROM LOW-SPEED MODE TO HIGH-SPEED MODE IN HIGH-SPEED INTERFACES

(75) Inventors: Joseph Macri, Sunnyvale, CA (US);
Steven Morein, Sunnyvale, CA (US);
Ming-Ju E. Lee, Sunnyvale, CA (US);
Lin Chen, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 642 days.

(21) Appl. No.: 11/804,413

(22) Filed: May 17, 2007

(65) Prior Publication Data

US 2008/0005455 A1    Jan. 3, 2008

Related U.S. Application Data

(60) Provisional application No. 60/801,328, filed on May 17, 2006.

(51) Int. Cl.
*G01R 31/28* (2006.01)
(52) U.S. Cl. .................. 713/400; 713/401; 713/500; 713/501; 713/502; 713/503; 713/600; 713/601
(58) Field of Classification Search ......... 713/400–401, 713/500–503, 600–601
See application file for complete search history.

(56) References Cited

U.S. PATENT DOCUMENTS

| | | | |
|---|---|---|---|
| 5,768,602 A | 6/1998 | Dhuey | |
| 5,925,133 A | 7/1999 | Buxton et al. | |
| 6,223,297 B1* | 4/2001 | Inoue | 713/501 |
| 6,691,071 B2* | 2/2004 | Kerr et al. | 702/188 |
| 6,938,177 B1* | 8/2005 | Blemel | 713/500 |
| 7,012,454 B2* | 3/2006 | Matsui et al. | 327/114 |
| 7,051,227 B2* | 5/2006 | Kazachinsky et al. | 713/500 |
| 7,240,266 B2* | 7/2007 | Farmer et al. | 714/731 |

OTHER PUBLICATIONS

Form PCT/ISA/220, "PCT Notification of Transmittal of The International Search Report and the Written Opinion of the International Searching Authority, or the Declaration," 2 pgs.
Form PCT/ISA/210, "PCT International Search Report," 3 pgs.
Form PCT/ISA/237, "PCT Written Opinion of the International Searching Authority," 5 pgs.

* cited by examiner

*Primary Examiner*—Abdelmoniem Elamin
(74) *Attorney, Agent, or Firm*—Courtney Staniford & Gregory LLP

(57) ABSTRACT

Embodiments directed to a memory device and a memory controller that continue to operate in a low-power mode during the period required for analog timing circuitry to initialize and become usable, are described. During a low-speed to high-speed transition mode of operation for a high-speed interface, timing circuitry of the interface between the memory device and memory controller locks to a forward clock signal concurrent with the continued operation of the interface in low-speed mode. A reference clock signal configured to operate at a rate that provides both a high-speed mode and a low-speed mode and which is used as a single rate clock allows phase detection and correction circuitry to be disabled, thus allowing the idle period caused by a transition from low-speed mode to high-speed mode to be significantly reduced.

27 Claims, 5 Drawing Sheets

FAST TRANSITION FROM LOW-SPEED MODE TO HIGH-SPEED MODE IN HIGH-SPEED INTERFACES

CROSS-REFERENCE TO RELATED APPLICATIONS

The present application claims the benefit of the U.S. Provisional Application No. 60/801,328 entitled "Fast Transition From Low-Speed Mode to High-Speed Mode in High-Speed Interfaces," and filed on May 17, 2006.

TECHNICAL FIELD

The disclosed embodiments relate to methods and apparatus for high speed interfaces, such as memory interfaces.

BACKGROUND OF THE DISCLOSURE

Many high-speed communications interfaces must be able to operate in a low-speed mode for some applications or platforms. For example, a laptop computer with limited power supplies and very high-speed memory components must have a low-speed mode in which the memory interface uses less power. Other reasons interfaces may be required to transition between low-speed modes and high-speed modes include user selection of one mode or another for a particular application or circumstance. Yet another reason is that in various circumstances the frequency of timing circuitry, for example phase locked loops (PLLs) may be changed, but some timing circuitry cannot change frequency during high-speed operation. The timing circuitry must be transitioned to a low-speed, in which the frequency is changed, and then the timing circuitry is transitioned to a high-speed mode again. In prior systems, this can cause significant performance degradation.

One example of a high-speed memory device is a double date rate dynamic random access memory (DRAM). Some DRAMs operate using high frequency (e.g. 1 GHz) sampling clock signals (also referred to as sampling clocks) that are generated from a single clock with a lower frequency (e.g., 500 MHz). The sampling clocks can be eight clocks, each separated by 45 degrees of phase. Generating the sampling clock generally requires power-consuming analog timing circuitry, e.g., a clock multiplier circuit or device, such as a delay locked loop (DLL) or phase locked loop (PLL). In the low speed mode, a digital timing circuit, such as a clock divider, which uses much less power than the clock multiplier, is typically used to divide the 500 MHz clock, for example to generate four 125 MHz clocks, each separated by 90 degrees of phase.

Switching from high-speed mode to low-speed mode generally does not require a significant bus idle time. The clock multiplier circuitry is turned off and the sampling clocks are generated by the digital clock divider circuitry. However, switching from low-speed mode to high-speed mode conventionally results in a significant amount of bus idle time during which no commands can be sent on the bus. This is illustrated in FIG. 1, which shows a transition between commands being sent by a controller during low-speed mode and high-speed mode. A shown in FIG. 1, a command or group of commands 102 are send during low-speed mode 106. The beginning of the transition, which is marked by a PLL-off cycle 103, can be followed by approximately 20,000 cycles of idle time 105. This idle time is caused primarily by the need to wait for the analog timing circuitry to power up and produce accurate, stable edges, after which time commands 104 can be sent in high-speed mode 108. This delay may cause unacceptable performance degradation. For example, in a graphics system it may not be possible to meet the monitor refresh requirements, making it impossible to provide a continuous stream of display information during a power state transition. For a central processing system (CPU), the thousands of idle clock cycles represent significant lost performance, and can result in a failure to meet a real time constraint.

BRIEF DESCRIPTION OF THE DRAWINGS

Embodiments are illustrated by way of example and not limitation in the figures of the accompanying drawings, in which like references indicate similar elements and in which.

DETAILED DESCRIPTION

Embodiments of the invention as described herein provide a solution to the problems of conventional methods as stated above. In the following description, various examples are given for illustration, but none are intended to be limiting. Embodiments include a memory device and a memory controller that continue to operate in a low-power mode during the period required for analog timing circuitry to initialize and become usable. Thus, the idle period caused by a transition from low-speed mode to high-speed mode is very significantly reduced.

In an embodiment, a controller-to-memory interface includes a low to high speed transition circuit for switching between low to high speed modes of transmission without requiring substantial idle time during the transition. During the transition to high-speed mode, the timing circuitry, such as a PLL, locks to a forward clock (FCLK) concurrent with the continued operation of the interface in low-speed mode. In an embodiment, the use of a defined number of reference clock cycles (e.g., eight cycles) in high-speed mode provides both a high-speed mode that meets performance goals, and a low-speed mode in which the same clock speed, used as a single rate clock, results in a data rate that is slow enough so that phase detection and correction is not required for successful operation. This allows phase detection and correction circuitry to be disabled.

Figure 1:
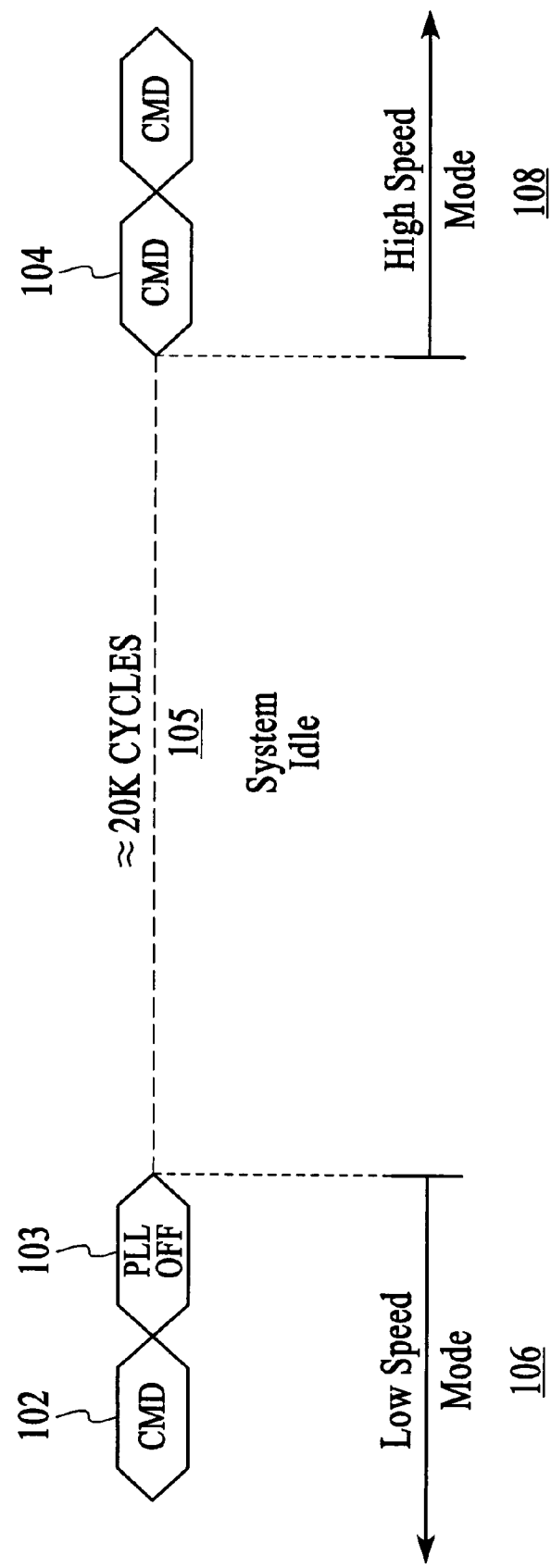
FIG. 1, which shows a transition between commands being sent by a controller during low-speed mode and high-speed mode.

In an embodiment, once the timing circuit is initialized (e.g., the PLL is locked), the switch to high-speed mode completes very quickly, and the bus is idle only for a small number of clock cycles relative to the idle time in current systems, such as illustrated by idle period 105 of FIG. 1.

Figure 2:
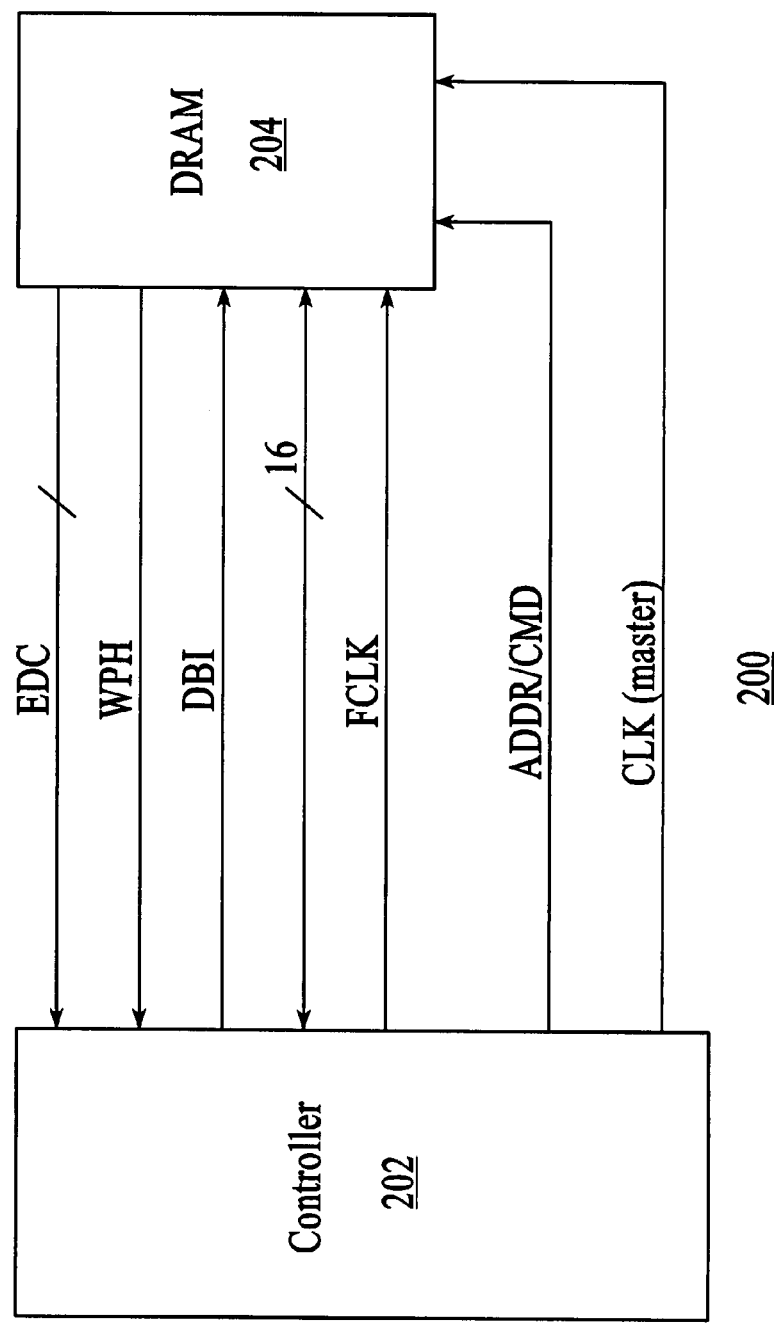
FIG. 2 illustrates a high-speed interface system, according an embodiment.

Referring to FIG. 2, a high-speed interface system according an embodiment is shown. The system 200 includes a memory controller 202 and a high-speed memory device 204 coupled by a high-speed interface. For purposes of description, a DRAM controller and DRAM will be referred to throughout, but the invention is not so limited. Embodiments as described herein are also applicable to any other type of memory device or class of memory devices. Moreover, memory device 204 may represent a single integrated circuit (IC) device, or a set of distributed IC devices, or a memory section within a larger IC device.

The high speed interface between the controller and the DRAM, (also referred to as a DRAM chip or memory chip) can operate in two primary modes. The first mode is a high-speed mode. In this mode, a forward clock signal is provided to the receiving DRAM chip 204, which operates at a fraction (e.g., one-eighth) of the data rate. In the second mode, a low-speed mode, the same clock is used to capture data at a lower data rate.

As shown in system 200, a channel of the interface between the controller 202 and memory 204 consists of error detection/correction (EDC) code signal lines, a write phase (WPH) line, a data bus inversion (DBI) line, 16 data lines, a forward clock (FCLK) line, and address/command line, and a master, or reference clock line. In one embodiment, the reference clock signal is generated in the controller chip, or integrated circuit, and directly provided to the input/output (IO) circuitry in the controller, and provided through the clock signals to the DRAM. When the direction of data from is from the controller to the DRAM, the reference clock signal is used in both the controller to output data, and in the receiver to capture data. The data pins and encoding pins are bidirectional: for write operations the data flow on these pins is from the controller to the DRAM, and for read operations the flow is from the DRAM to the controller. The EDC and WPH pins are always unidirectional from the DRAM to the controller.

Although in the example of FIG. 2, the clock pin is shown to be driven from the controller to the DRAM, the clock signal could also be sourced from elsewhere in the system containing the components, and both components (DRAM and controller) could have this externally sourced clock signal as an input.

As an example, it is assumed that an implementation in the DRAM is "quarter rate", meaning the clock speed used in the DRAM to capture data is one-fourth the data rate. Various embodiments include implementations ranging from full speed or double speed to 1/16 speed or slower, for example.

Figure 3:
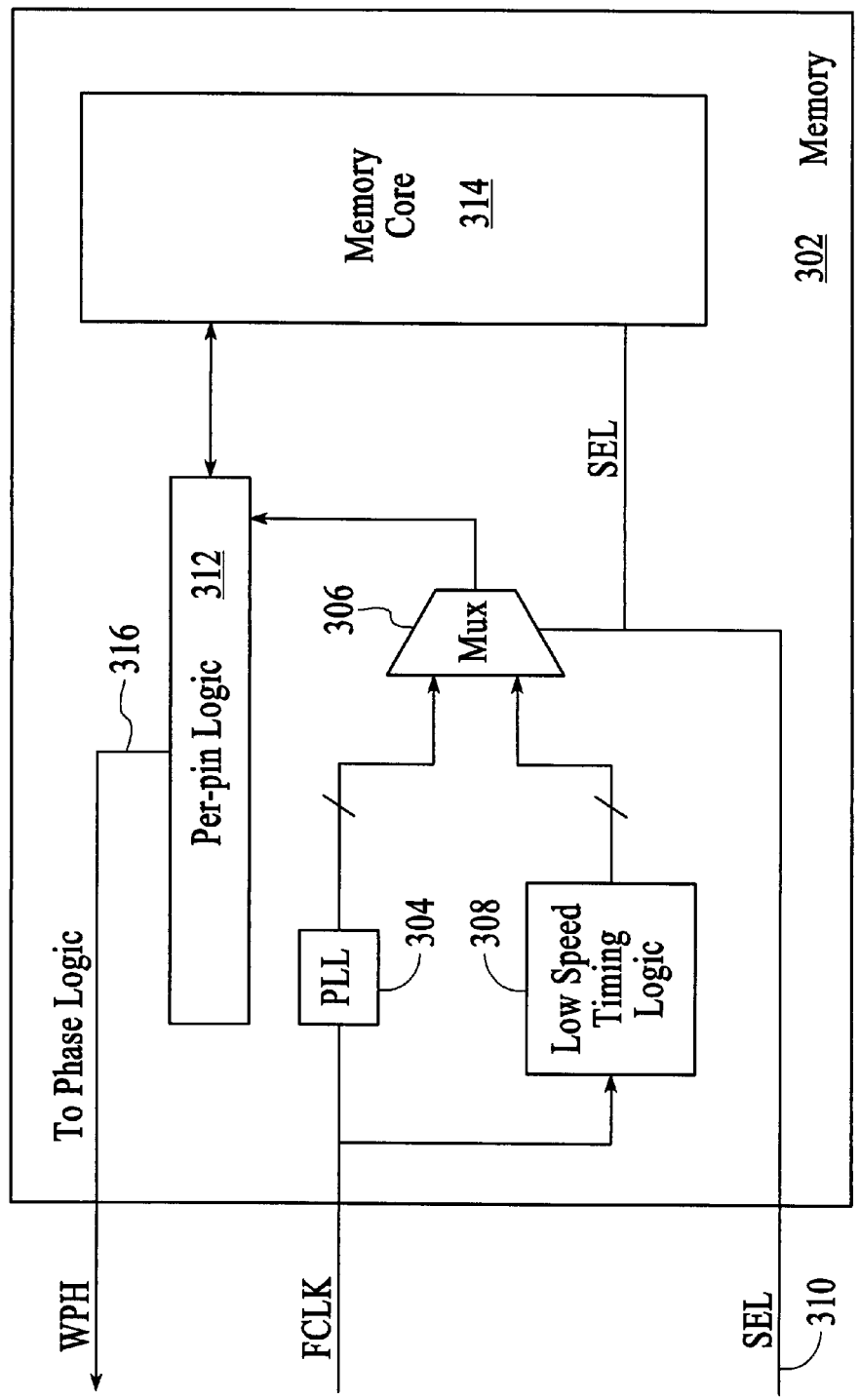
FIG. 3 is a block diagram of elements of a DRAM device, under an embodiment.

FIG. 3 is a block diagram of elements of a DRAM device, under an embodiment. The memory 302 elements include a PLL 304 (which in other embodiments can also be a different type of timing element capable of clock multiplication) for high-speed mode, and low-speed digital timing logic for low-speed mode. A multiplexer (MUX) 306 receives the phases output by the PLL 302 and a low-speed timing logic 308, and outputs one or the other based on the state of a select signal 310, as further described below.

The phases are input to "per-pin" logic 312, which includes flip-flops and phase detection elements as needed for each pin. The per-pin logic 312 communicates with a memory core 314 of the DRAM and also with the controller (not shown). The DRAM includes separate clock paths and modes for low-speed operation and high-speed operation. The high-speed path includes a high-speed analog timing circuit (in this example a PLL). The low-speed path includes low-speed digital timing logic.

In the high-speed mode, the select signal 310 in the high-speed mode causes the MUX 306 to transfer the output of the PLL 304 to the per-pin logic 312. In the high-speed mode of an embodiment, the DRAM 302 receives a 500 MHz FCLK in the PLL 304, and generates eight phases at twice (2×) the frequency. Four of the phases (i.e., at 0 degrees, 90 degrees, 180 degrees, and 270 degrees) are used to capture the date during a write operation, and to launch data during a read operation. The remaining four phases (i.e., at 45 degrees, 135 degrees, 225 degrees, and 305 degrees) are used in a write operation to capture phase information. Phase information indicates whether the data is early or late relative to the edge used to capture the data. In the high-speed mode of an embodiment, the phase information of the DRAM is encoded and sent back to the controller in a "phase loop" (shown as the "to phase logic" line 316) where it is used to adjust the phase of the transmitter to center the data.

In the low-speed mode, the select signal 310 in the low-speed mode causes the MUX 306 to transfer the output of the low-speed timing logic 308 to the per-pin logic. In the low-speed mode of an embodiment, the DRAM receives the 500 MHz FCLK clock in the low-speed timing logic, and uses the rising edge of the 500 MHz clock to capture data. Alternatively, the DRAM can use the 500 MHz clock to generate four phases of a 125 MHz clock using the rising edge and an additional four phases of the 125 MHz clock using the falling edge. In this low-speed mode, a PLL is not required in the DRAM. The PLL 304 can thus be disabled in low-speed mode to reduce power consumption. At the speeds normally used in low-speed mode, there is sufficient timing margin such that the phase margin is large enough to obviate the need for phase detection and correction using the phase loop. Thus, the phase loop can also be disabled in the low-speed mode, and the additional four phases used for phase capture are not required.

Although embodiments have been described with reference to specific clock speeds and clock phases, it should be understood that any other clock speeds or clock phases may be used depending upon the requirements, constraints, and performance capabilities of the memory devices, controllers, and interface system.

Figure 4:
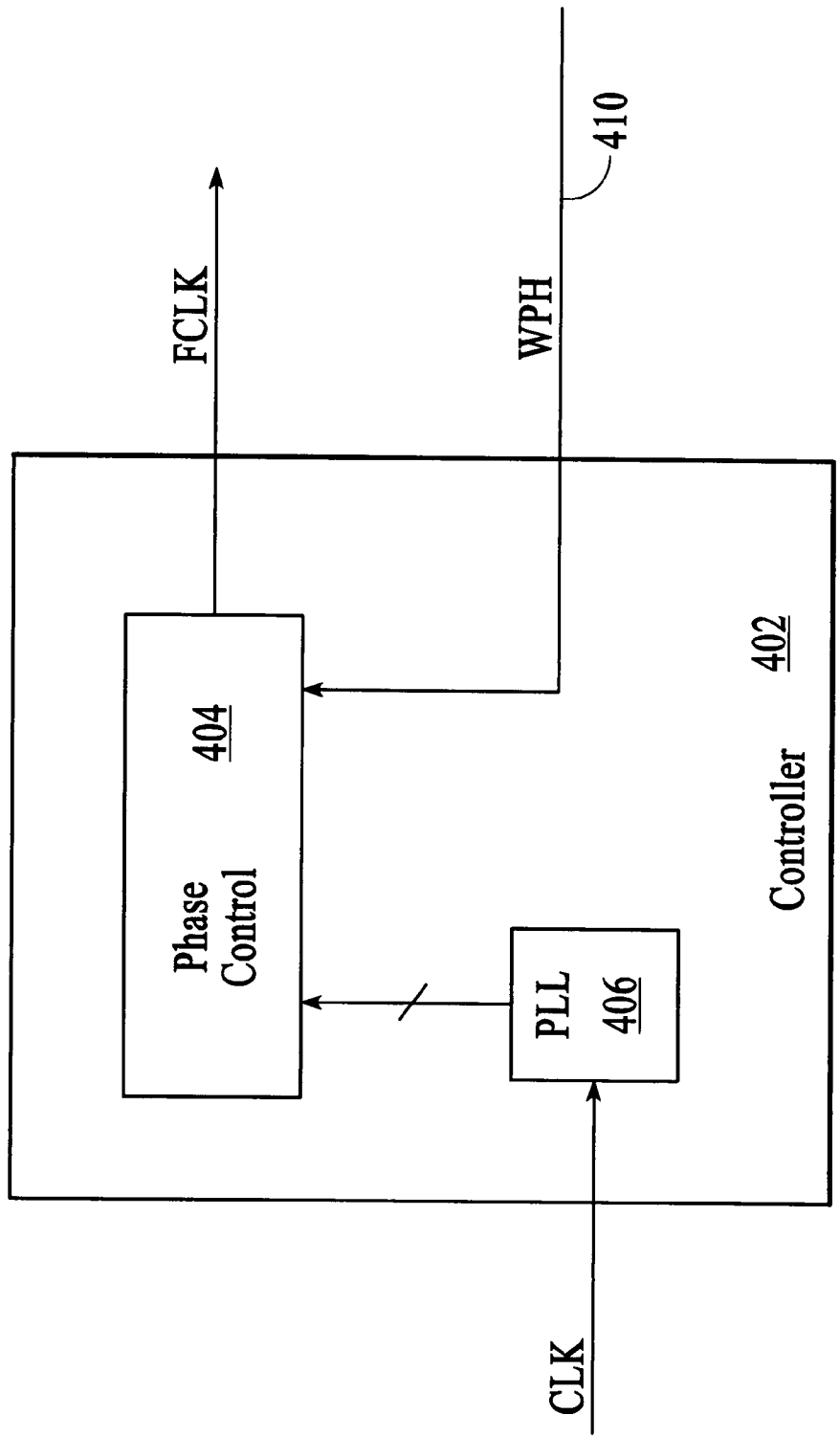
FIG. 4 is a block diagram of elements of the controller, including a controller PLL and phase control circuitry, according to an embodiment.

FIG. 4 is a block diagram of elements of the controller, including a controller PLL and phase control circuitry, according to an embodiment. Controller 402 includes, among other components, a PLL 404 and a phase control circuit 406. For read operations the controller 402 detects phase in a similar manner to the DRAM (e.g., DRAM 302 of FIG. 3), using phases generated by the controller PLL 406. The controller adjusts the sampling clock signal 408 (which includes locally generated phases in the controller) to sample the data as close as possible to the center of the data eye.

The write phase signal (WPH) 410 is received from the DRAM 302 in high-speed mode when the phase loop is enabled. During low-speed mode, the phase loop is disabled. In one embodiment, the phase loop comprises the circuit created by the PLL 304 and MUX 306 when the select signal activates selection of the PLL input to the MUX. In this manner, high-speed mode or low-speed mode can be selected by the select signal 302 in a variety of ways in different embodiments.

Figure 5:
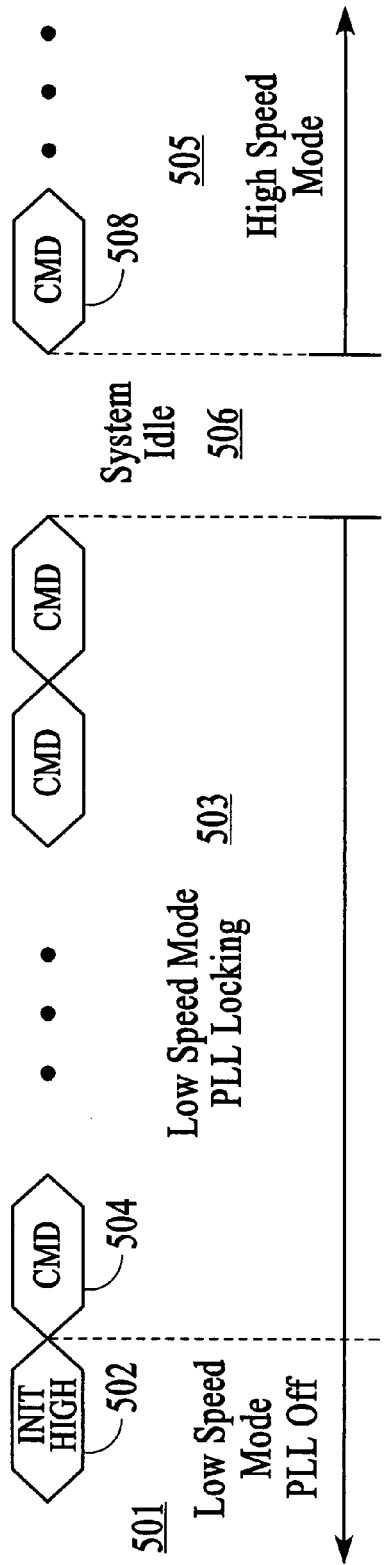
FIG. 5 is a timing diagram showing a transition from low-speed mode to high-speed mode, according to an embodiment.

FIG. 5 is a timing diagram showing a transition from low-speed mode to high-speed mode according to an embodiment. An initiate high-speed mode (INIT HIGH) command is sent on the command/address lines of the interface during the low-speed mode 501. In response to the INIT high command, the high-speed timing circuit (e.g., the PLL) is turned on and begins to lock. While the PLL locks, the interface continues to operate in the low-speed mode 503. During this low-speed mode time 503, commands 504 are sent and received on the interface. The INIT HIGH command 502 specifies a number of cycles, or alternatively a period of time, to wait before completing the transition from low-speed mode to high-speed mode 505 by selecting the output of the MUX 306 to be the output of the PLL 304. When the transition is completed from low-speed mode 503, a relatively small number of idle cycles 506 occur on the interface, as shown. After the transition to high-speed mode 505, commands 508 are transmitted in this high-speed mode.

Figure 6:
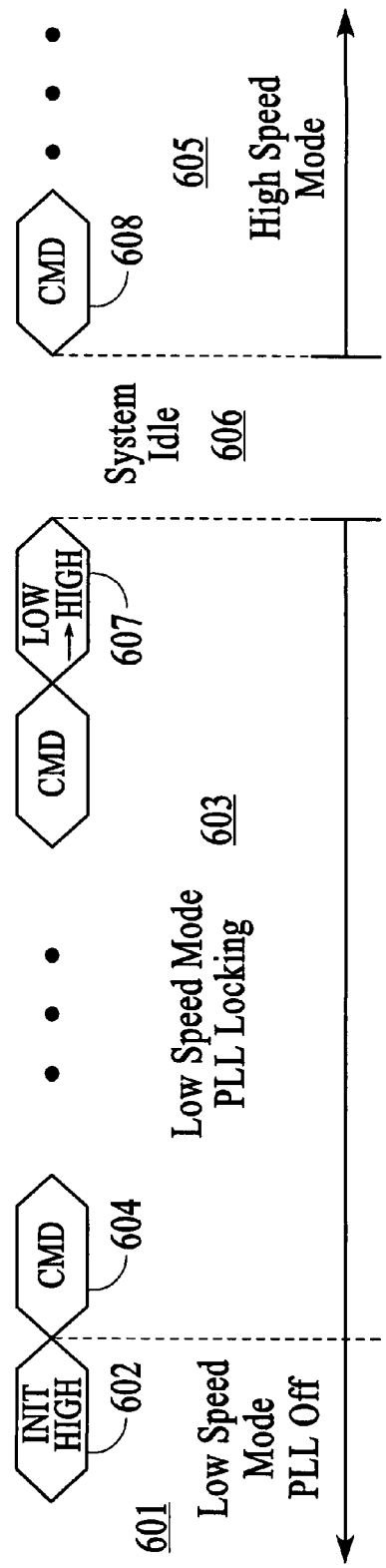
FIG. 6 is a timing diagram showing a transition from low-speed mode to high-speed mode according to another embodiment.

FIG. 6 is a timing diagram showing a transition from low-speed mode to high-speed mode according to another embodiment. For this embodiment, an initiate high-speed mode (INIT HIGH) command 602 is sent on the command/address lines of the interface during the low-speed mode 601. In response to the INIT high command, the high-speed timing circuit (e.g., the PLL) is turned on and begins to lock. While the PLL locks, the interface continues to operate in the low-speed mode 603; commands 604 are sent and received on the interface. The INIT HIGH command 602 only turns on the PLL. When the PLL is initialized (locked), a LOW-HIGH command 607 causes the transition from low-speed mode 603 to high-speed mode 605 to be completed after a short idle period 606 by selecting the output of the MUX 306 to be the output of the PLL 304. In an embodiment, the INIT-HIGH command 607 is sent after a predetermined period or number of cycles. In another embodiment, the PLL 304 is queried to determine when it is completely initialized.

The signal on the select pin of the MUX 306 may be generated off of the controller 202 and sent to the DRAM chip 302. Alternatively, the signal on the select pin may originate in the DRAM. For example, a value in a DRAM register can be written when the PLL is initialized. The register is read to determine the value on the select pin. Alternatively, the value on the select pin can originate directly from a pin, such as command/address pin or the WPH pin.

In one embodiment, the circuit implementing the low-speed to high-speed transition can be any implemented in any type of bus-based interface, such as DDR interfaces, or any other memory or device interface. Furthermore, it may be implemented in any type of VLSI or ULSI chip, or any type of Application Specific Integrated Circuit (ASIC) that is used in or as part of a processor, co-processor, arithmetic logic units, or other processing units. Such a processing unit can be a Graphics Processing Unit (GPU), or Visual Processing Unit (VPU), which is a dedicated or integrated graphics rendering device for a personal computer, workstation, handheld device, digital television, game console or any other device that interfaces with memory and for which power conservation or the need to support various speed dependent applications is a characteristic.

A method of an embodiment comprises transmitting data from a first device to a second device at a first data rate; transmitting a speed transition command to the second device to enable transmission of data to the second device at a second data rate that is higher than the first data rate; transmitting data from the first device to the second device at the second data rate after an idle period required to allow transition of circuitry in the second device to the second data rate; and transmitting data from the first device to the second device at the first data rate during a transition period comprising a period of time in which the circuitry of the second device is adapting to operation at the second data rate. This eliminates disadvantages in current memory and other data interface systems in which switching between two speed modes requires a lengthy period of time in which no data is transmitted over the interface, such as in systems wherein the first device comprises a memory controller and the second device comprises a random access memory device. A method of an embodiment includes generating a reference clock signal that is configured to operate as both a high-speed mode clock and a low-speed mode clock; and synchronizing a timing circuit in the memory device to a lock to the reference clock signal. A method of and embodiment further comprises generating the low-speed mode clock by switching the timing circuitry to a first state; and generating the high-speed mode clock by switching the timing circuit to a second state. A method of an embodiment further specifies the first state of the timing circuit comprising the reference clock signal routed through a low speed timing logic circuit within the memory device, and the second state of the timing circuit comprising the reference clock signal routed through a frequency multiplier circuit within the memory device. In an embodiment, the frequency multiplier circuit comprises a phase locked loop circuit within the memory device, and the idle period comprises a defined number of clock cycles of the reference clock signal. In a method of an embodiment, the defined number of clock cycles is contained in the speed transition command, the speed transition command only activates the circuitry of the second device to operate at the second data rate, the method further comprising transmitting the low-to-high speed transition command after one or more commands are sent during the transition period. In a method of an embodiment, the circuitry of the second device is queried to determine transition to the second data rate, and the idle period is ended by a positive response to the query.

In an embodiment for communicating data in an electronic system, a method comprises transmitting data via an interface at a first data rate using first timing circuitry; transmitting data via the interface at a second data rate using second timing circuitry; and transitioning from transmitting data at the first data rate to transmitting data at the second data rate, by initializing the second timing circuitry, and continuing to transmit data at the first data rate during a period required to initialize the second timing circuitry. In a method of an embodiment, the second data rate is higher than the first data rate. In a further method of an embodiment, the first timing circuitry comprises a reference clock signal gated through a low-speed logic circuit and a switch, and wherein the second timing circuit comprises the reference clock signal gated through a clock multiplier circuit and the switch. In yet a further method of an embodiment the switch comprises a multiplexer controlled by a select signal generated by a first device controlling transmission of data over the interface, and the first device comprises a memory controller coupled to a random access memory device over the interface. In a method of an embodiment, the clock multiplier circuit comprises a phase locked loop coupled to the multiplexer.

In one embodiment, a memory control circuit comprises a transceiver sending and receiving data to and from a memory over an interface at a first data rate; a command circuit transmitting a speed transition command to initialize a timing circuit within the memory to perform data operations at a second data rate that is higher than the first data rate, the command circuit further transmitting a select signal to signal the timing circuit to switch between operation at the first data rate and operation at the second data rate, wherein the memory performs data operations at said first data rate during the transition period. In a memory control circuit of an embodiment, the timing circuit within the memory comprises a first timing portion routing a reference clock signal through a low-speed logic circuit and a switch, and a second portion routing the reference clock signal gated through a clock multiplier circuit and the switch. In a memory control circuit of an embodiment, the clock multiplier circuit comprises a phase locked loop coupled to the multiplexer. In a memory control circuit of an embodiment, the switch comprises a multiplexer controlled by the select signal generated by the memory control circuit.

In an embodiment, a method comprises communicating data to and from a controller device over an interface at a first data rate; communicating data to and from the controller device at a second data rate that is higher than the first data rate in response to a speed transition command; adapting, during a transition period, one or more circuits to communicate data at the second data rate; communicating data to and from the controller device at the first data rate during the transition period; and communicating data to and from the controller device at the second data rate after the transition period. In a method of an embodiment, the speed transition command is received from the controller device over the interface in a memory device storing at least a portion of the data.

In an embodiment, an apparatus comprises a transceiver circuit communicating data to and from a controller device over an interface at a first data rate, and at a second data rate that is higher than the first data rate; and a logic circuit training the transceiver, during a transition period, to communicate data over the interface at the second data rate from the first data rate in response to a speed transition command, wherein the transceiver circuit communicates data to and from the controller device at the first data rate during the transition period, and communicates data to and from the controller device at the second data rate after the transition period. In an apparatus of an embodiment, the speed transition command is received from a controller device over an interface, the apparatus further comprising a memory core storing at least a portion of the communicated data.

In an embodiment, a system comprises a memory device having a memory core storing data and a timing circuit synchronizing memory operations consisting of transmission and reception of data to the memory core; and a controller device coupled to the memory device over an interface, the controller device having a transceiver sending and receiving data to and from the memory device over the interface at a first data rate, and a command circuit transmitting a speed transition command over the interface to initialize the timing circuit within the memory device to perform memory operations at a second data rate that is higher than the first data rate, the command circuit further transmitting a select signal to signal the timing circuit to switch between memory operations at the first data rate and operation at the second data rate, wherein the memory device performs memory operations at said first data rate during the transition period. In a system of an embodiment, the system comprises a computing device, and the computing device is selected from the group consisting of: a personal computer, a workstation, a handheld computing device, a digital television, a media playback device, and a game console.

Aspects of the speed transition process and system described herein may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects of the power management process may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, and so on).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the speed transition process is not intended to be exhaustive or to limit the embodiments to the precise form or instructions disclosed. While specific embodiments of, and examples for, processes in graphic processing units or ASICs are described herein for illustrative purposes, various equivalent modifications are possible within the scope of the disclosed methods and structures, as those skilled in the relevant art will recognize.

The elements and acts of the various embodiments described above can be combined to provide further embodiments. These and other changes can be made to the disclosed system in light of the above detailed description.

In general, in the following claims, the terms used should not be construed to limit the disclosed method to the specific embodiments disclosed in the specification and the claims, but should be construed to include all operations or processes that operate under the claims. Accordingly, the disclosed structures and methods are not limited by the disclosure, but instead the scope of the recited method is to be determined entirely by the claims.

While certain aspects of the disclosed embodiments are presented below in certain claim forms, the inventors contemplate the various aspects of the methodology in any number of claim forms. For example, while only one aspect may be recited as embodied in machine-readable medium, other aspects may likewise be embodied in machine-readable medium. Accordingly, the inventors reserve the right to add additional claims after filing the application to pursue such additional claim forms for other aspects.

What is claimed is:

1. A method comprising:
    transmitting data from a first device to a second device at a first data rate;
    transmitting a speed transition command to the second device to enable transmission of data to the second device at a second data rate that is higher than the first data rate;
    transmitting data from the first device to the second device at the second data rate after an idle period required to allow transition of circuitry in the second device to the second data rate; and
    transmitting data from the first device to the second device at the first data rate during a transition period comprising a period of time in which the circuitry of the second device is adapting to operation at the second data rate.

2. The method of claim 1 wherein the first device comprises a memory controller and the second device comprises a random access memory device.

3. The method of claim 2 further comprising:
    generating a reference clock signal that is configured to operate as both a high-speed mode clock and a low-speed mode clock; and
    synchronizing a timing circuit in the memory device to a lock to the reference clock signal.

4. The method of claim 3 further comprising:
    generating the low-speed mode clock by switching the timing circuitry to a first state; and
    generating the high-speed mode clock by switching the timing circuit to a second state.

5. The method of claim 4 wherein the first state of the timing circuit comprises the reference clock signal routed through a low speed timing logic circuit within the memory device, and wherein the second state of the timing circuit comprises the reference clock signal routed through a frequency multiplier circuit within the memory device.

6. The method of claim 5 wherein the frequency multiplier circuit comprises a phase locked loop circuit within the memory device.

7. The method of claim 1 wherein the idle period comprises a defined number of clock cycles of the reference clock signal.

8. The method of claim 7 wherein the defined number of clock cycles is contained in the speed transition command.

9. The method of claim 6 wherein the speed transition command only activates the circuitry of the second device to operate at the second data rate, the method further comprising transmitting the low-to-high speed transition command after one or more commands are sent during the transition period.

10. The method of claim 8 wherein the circuitry of the second device is queried to determine transition to the second data rate, and wherein the idle period is ended by a positive response to the query.

11. A method for communicating data in an electronic system, comprising:
    transmitting data via an interface at a first data rate using first timing circuitry;
    transmitting data via the interface at a second data rate using second timing circuitry; and
    transitioning from transmitting data at the first data rate to transmitting data at the second data rate, by
        initializing the second timing circuitry; and
        continuing to transmit data at the first data rate during a period required to initialize the second timing circuitry.

12. The method of claim 11 wherein the second data rate is higher than the first data rate.

13. The method of claim 12 wherein the first timing circuitry comprises a reference clock signal gated through a low-speed logic circuit and a switch, and wherein the second timing circuit comprises the reference clock signal gated through a clock multiplier circuit and the switch.

14. The method of claim 13 wherein the switch comprises a multiplexer controlled by a select signal generated by a first device controlling transmission of data over the interface.

15. The method of claim 14 wherein the first device comprises a memory controller coupled to a random access memory device over the interface.

16. The method of claim 15 wherein the clock multiplier circuit comprises a phase locked loop coupled to the multiplexer.

17. A memory control circuit comprising:
    a transceiver sending and receiving data to and from a memory over an interface at a first data rate;
    a command circuit transmitting a speed transition command to initialize a timing circuit within the memory to perform data operations at a second data rate that is higher than the first data rate, the command circuit further transmitting a select signal to signal the timing circuit to switch between operation at the first data rate and operation at the second data rate, wherein the memory performs data operations at said first data rate during the transition period.

18. The memory control circuit of claim 17 wherein the timing circuit within the memory comprises a first timing portion routing a reference clock signal through a low-speed logic circuit and a switch, and a second portion routing the reference clock signal gated through a clock multiplier circuit and the switch.

19. The memory control circuit of claim 18 wherein the clock multiplier circuit comprises a phase locked loop coupled to the multiplexer.

20. The memory control circuit of claim 19 wherein the switch comprises a multiplexer controlled by the select signal generated by the memory control circuit.

21. A method comprising:
    communicating data to and from a controller device over an interface at a first data rate;
    communicating data to and from the controller device at a second data rate that is higher than the first data rate in response to a speed transition command;
    adapting, during a transition period, one or more circuits to communicate data at the second data rate;
    communicating data to and from the controller device at the first data rate during the transition period; and
    communicating data to and from the controller device at the second data rate after the transition period.

22. The method of claim 21 wherein the speed transition command is received from the controller device over the interface in a memory device storing at least a portion of the data.

23. An apparatus comprising:
    a transceiver circuit communicating data to and from a controller device over an interface at a first data rate, and at a second data rate that is higher than the first data rate; and
    a logic circuit training the transceiver, during a transition period, to communicate data over the interface at the second data rate from the first data rate in response to a speed transition command, wherein the transceiver circuit communicates data to and from the controller device at the first data rate during the transition period, and communicates data to and from the controller device at the second data rate after the transition period.

24. The apparatus of claim 23 the speed transition command is received from a controller device over an interface, the apparatus further comprising a memory core storing at least a portion of the communicated data.

25. A system comprising:
 a memory device having a memory core storing data and a timing circuit synchronizing memory operations consisting of transmission and reception of data to the memory core; and
 a controller device coupled to the memory device over an interface, the controller device having a transceiver sending and receiving data to and from the memory device over the interface at a first data rate, and a command circuit transmitting a speed transition command over the interface to initialize the timing circuit within the memory device to perform memory operations at a second data rate that is higher than the first data rate, the command circuit further transmitting a select signal to signal the timing circuit to switch between memory operations at the first data rate and operation at the second data rate, wherein the memory device performs memory operations at said first data rate during the transition period.

26. The system of claim 25 wherein the system comprises a computing device.

27. The system of claim 26 wherein the computing device is selected from the group consisting of: a personal computer, a workstation, a handheld computing device, a digital television, a media playback device, and a game console.

* * * * *